United States Patent
Miao

(10) Patent No.: US 11,605,685 B2
(45) Date of Patent: Mar. 14, 2023

(54) ORGANIC LIGHT EMITTING DIODE DISPLAY SUBSTRATE COMPRISING SUB-PIXELS, DETECTION LINES AND A SIGNAL PORT, AND METHOD FOR DRIVING THE SAME

(71) Applicants: Chengdu BOE Optoelectronics Technology Co., Ltd., Sichuan (CN); BOE TECHNOLOGY GROUP CO., LTD., Beijing (CN)

(72) Inventor: Xinyou Miao, Beijing (CN)

(73) Assignees: Chengdu BOE Optoelectronics Technology Co., Ltd., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 193 days.

(21) Appl. No.: 17/048,644

(22) PCT Filed: Mar. 17, 2020

(86) PCT No.: PCT/CN2020/079676
§ 371 (c)(1),
(2) Date: Oct. 19, 2020

(87) PCT Pub. No.: WO2020/187200
PCT Pub. Date: Sep. 24, 2020

(65) Prior Publication Data
US 2021/0159295 A1  May 27, 2021

(30) Foreign Application Priority Data
Mar. 19, 2019 (CN) .................... 201910208781.6

(51) Int. Cl.
*H01L 29/08* (2006.01)
*H01L 27/32* (2006.01)
*G09G 3/3275* (2016.01)

(52) U.S. Cl.
CPC ....... *H01L 27/3262* (2013.01); *G09G 3/3275* (2013.01); *H01L 27/3265* (2013.01); *H01L 27/3276* (2013.01); *G09G 2300/0426* (2013.01)

(58) Field of Classification Search
CPC ............. H01L 27/3262; H01L 27/3265; H01L 27/3276
(Continued)

(56) References Cited

U.S. PATENT DOCUMENTS

2005/0200377 A1  9/2005  Orii et al.
2016/0225312 A1  8/2016  Byun et al.
(Continued)

FOREIGN PATENT DOCUMENTS

CN     1479911 A    3/2004
CN   104809986 A    7/2015
(Continued)

OTHER PUBLICATIONS

China Patent Office, Second Office Action dated Jul. 14, 2021, for corresponding Chinese application 201910208781.6.
(Continued)

*Primary Examiner* — Phuc T Dang
(74) *Attorney, Agent, or Firm* — Houtteman Law LLC

(57) ABSTRACT

The present disclosure provides an OLED display substrate and a driving method thereof. The OLED display substrate includes: sub-pixels arranged in array, detection lines, and at least one signal port. Each column of sub-pixels is coupled to one detection line, each signal port is coupled to at least two detection lines, and each detection line is coupled to one column of sub-pixels. Each sub-pixel includes a light emitting element and a first control circuit coupled thereto. The first control circuit is configured to transmit a voltage at one terminal of the light emitting element to a first node in
(Continued)

response to a first control signal provided by a first control line. The OLED display substrate further includes a second control circuit configured to transmit a voltage at the first node to a corresponding signal port in response to a second control signal provided by a second control line.

20 Claims, 3 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2017/0169767 A1 | 6/2017 | Song | |
| 2017/0221422 A1 | 8/2017 | Hwang et al. | |
| 2017/0256198 A1 | 9/2017 | Hwang et al. | |
| 2018/0061296 A1* | 3/2018 | Shim | G09G 3/3258 |
| 2018/0308430 A1 | 10/2018 | Xu | |
| 2019/0304362 A1 | 10/2019 | Yuan et al. | |
| 2020/0105197 A1 | 4/2020 | Yin | |
| 2020/0152101 A1 | 5/2020 | Li et al. | |

FOREIGN PATENT DOCUMENTS

| | | | | |
|---|---|---|---|---|
| CN | 105243996 A | | 1/2016 | |
| CN | 106157895 A | | 11/2016 | |
| CN | 106683605 A | | 5/2017 | |
| CN | 107016964 A | | 8/2017 | |
| CN | 107038999 A | | 8/2017 | |
| CN | 107039004 A | * | 8/2017 | ............ G09G 3/006 |
| CN | 108109588 A | | 6/2018 | |
| CN | 108417169 A | | 8/2018 | |
| CN | 109166517 A | | 1/2019 | |
| CN | 109817134 A | | 5/2019 | |
| KR | 20100070237 A | | 6/2010 | |
| KR | 20180130207 A | | 12/2018 | |

OTHER PUBLICATIONS

China Patent Office, First Office Action dated Feb. 2, 2021, for corresponding Chinese application 201910208781.6.

* cited by examiner

ORGANIC LIGHT EMITTING DIODE DISPLAY SUBSTRATE COMPRISING SUB-PIXELS, DETECTION LINES AND A SIGNAL PORT, AND METHOD FOR DRIVING THE SAME

CROSS REFERENCE TO RELATED APPLICATION

This is a National Phase Application filed under 35 U.S.C. 371 as a national stage of PCT/CN2020/079676, filed on Mar. 17, 2020, an application claiming priority to Chinese patent application No. 201910208781.6, filed on Mar. 19, 2019, the entire contents of which are incorporated herein by reference.

TECHNICAL FIELD

The present disclosure belongs to the field of display technology, and particularly relates to an OLED display substrate and a method for driving the same.

BACKGROUND

The organic light emitting diode (OLED) display device has many advantages such as self-luminescence, low driving voltage, high luminous efficiency, short response time, high definition and contrast, nearly 1800 viewing angle, wide operating temperature range, and capability of realizing flexible display and large-area full-color display, and is considered as the most promising display device in the industry.

SUMMARY

In a first aspect, the present disclosure provides a low manufacturing cost organic light emitting diode (OLED) display substrate.

According to an embodiment of the present disclosure, an OLED display substrate includes: a plurality of sub-pixels arranged in an array, a plurality of detection lines, and at least one signal port, where each column of sub-pixels is coupled to one of the plurality of detection lines, each signal port is coupled to at least two detection lines, and each of the at least two detection lines is coupled to one column of sub-pixels; each sub-pixel includes a light emitting element and a first control circuit coupled to the light emitting element, where the first control circuit is configured to transmit a voltage at one terminal of the light emitting element to a first node in response to a first control signal provided by a first control line; and the OLED display substrate further includes a second control circuit between the first node for each sub-pixel and a signal port coupled to the sub-pixel, and the second control circuit is configured to transmit a voltage at the first node to a corresponding signal port in response to a second control signal provided by a second control line.

In some embodiments, the first control circuit includes a first control transistor having a control electrode coupled to the first control line, a first electrode coupled to one terminal of the light emitting element, and a second electrode coupled to the first node.

In some embodiments, the second control circuit includes a second control transistor having a control electrode coupled to the second control line, a first electrode coupled to the first node, and a second electrode coupled to a corresponding signal port.

In some embodiments, each sub-pixel is coupled to a detection line through one second control transistor.

In some embodiments, the first node for each sub-pixel is coupled to a detection line corresponding to the sub-pixel and each column of sub-pixels is coupled to a corresponding signal port through one second control transistor.

In some embodiments, control electrodes of all second control transistors corresponding to each column of sub-pixels are coupled to a same second control line.

In some embodiments, control electrodes of first control transistors in a same row of sub-pixels are coupled to a same first control line.

In some embodiments, sub-pixels in a same column have a same color, and each signal port is coupled to at least two columns of sub-pixels having different colors.

In some embodiments, control electrodes of second control transistors coupled to sub-pixels having a same color are coupled to a same second control line.

In some embodiments, each of the plurality of sub-pixels further includes a switch transistor and a driving transistor, and the driving transistor is configured to drive the light emitting element to emit light, the switch transistor has a control electrode coupled to a gate line, a first electrode coupled to a data line, and a second electrode coupled to a control electrode of the driving transistor; the driving transistor has a first electrode coupled to a first voltage terminal, and a second electrode coupled to the first electrode of the first control transistor; and the other terminal of the light emitting element is coupled to a second voltage terminal.

In some embodiments, control electrodes of switch transistors in each row of sub-pixels of the plurality of sub-pixels are coupled to a same gate line, first electrodes of switch transistors in each column of sub-pixels of the plurality of sub-pixels are coupled to a same data line, and the control electrode of the first control transistor of each sub-pixel in a same row is coupled to a same first control line.

In some embodiments, each sub-pixel further includes a storage capacitor, which has a first terminal coupled to the second electrode of the switch transistor, and a second terminal coupled to the second electrode of the driving transistor.

In a second aspect, the present disclosure provides a method for driving an organic light emitting diode (OLED) display substrate, including: in a detection phase for a row of sub-pixels, providing a turn-on signal to the first control line corresponding to the row of sub-pixels, and providing a turn-on signal to the second control line corresponding to a to-be-detected sub-pixel in the row of sub-pixels, wherein different sub-pixels in a same row and coupled to a same signal port serve as the to-be-detected sub-pixel at different times.

In some embodiments, each of the plurality of sub-pixels includes a switch transistor and a driving transistor, where control electrodes of switch transistors in each row of sub-pixels of the plurality of sub-pixels are coupled to a same gate line, first electrodes of switch transistors in each column of sub-pixels of the plurality of sub-pixels are coupled to a same data line, and a control electrode of the first control transistor of each sub-pixel in a same row is coupled to a same first control line, where the method includes: in a detection phase for a row of sub-pixels, providing a turn-on signal to a gate line and a first control line corresponding to the row of sub-pixels, providing a turn-off signal to gate lines corresponding to remaining rows of sub-pixels, providing a detection signal to each data line, providing a turn-on signal to a second control line corresponding to sub-pixels in a column to which the to-be-detected sub-pixel belongs, and providing a turn-off signal to second control lines corresponding to remaining columns of sub-pixels, so as to detect the to-be-detected sub-pixel to obtain a detection value.

In some embodiments, the detection signal is a display signal capable of causing the light emitting element to emit light.

In some embodiments, the detection signal is a display signal capable of causing the OLED display substrate to display a white image with a predetermined brightness.

In some embodiments, the detection phase for the OLED display substrate includes a plurality of detection sub-phases, in each of the plurality of detection sub-phases, a to-be-detected sub-pixel in a row of sub-pixels is detected, each of the plurality of detection sub-phases is within a holding time after a display time of each frame of image, and in the detection phase, each of the plurality of sub-pixels is detected once as the to-be-detected sub-pixel.

In some embodiments, the OLED display substrate is detected periodically.

In some embodiments, after the to-be-detected sub-pixel in any row of sub-pixels of the plurality of sub-pixels has been detected, the method further includes: comparing the obtained detection value with an original value of a corresponding sub-pixel, so as to obtain a compensation value for the sub-pixel.

In some embodiments, the sub-pixel is compensated for by: changing a display signal provided by a data line corresponding to the sub-pixel based on the compensation value; and compensating a voltage of a light emitting element in the sub-pixel based on the compensation value through a detection line corresponding to the sub-pixel.

DETAILED DESCRIPTION

Figure 1:
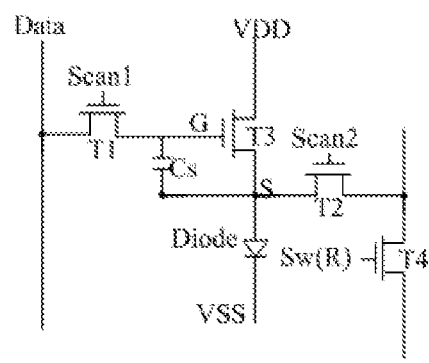
FIG. 1 is a schematic circuit diagram of a sub-pixel of an OLED display substrate according to an embodiment of the present disclosure.
Figure 2:
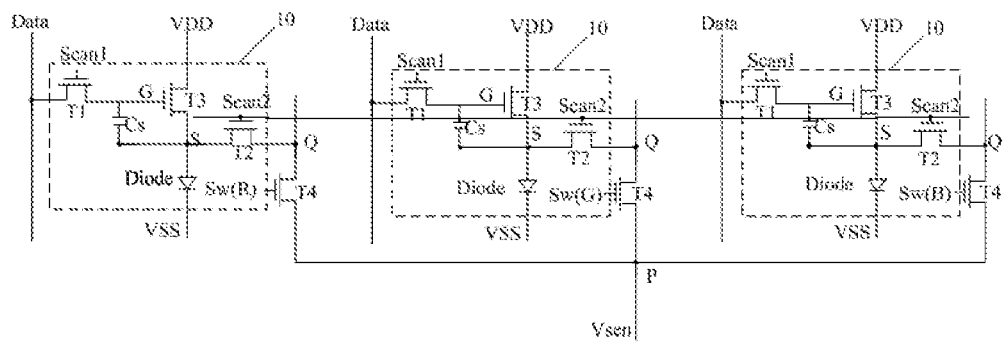
FIG. 2 is a schematic circuit diagram of a group of sub-pixels of an OLED display substrate according to an embodiment of the present disclosure.

The present disclosure will be described in more detail below with reference to the accompanying drawings. Like elements are denoted by like reference numerals throughout the various figures. For purposes of clarity, the various features in the drawings are not drawn to scale. Moreover, certain well-known elements may not be shown in the figures.

Numerous specific details of the present disclosure, such as structures, materials, dimensions, treatment processes and techniques of components, are set forth in the following description, in order to provide a more thorough understanding of the present disclosure. However, as will be understood by those skilled in the art, the present disclosure may be practiced without these specific details.

In an active matrix OLED (AMOLED) display device, as the driving time increases, the light emitting element (OLED) of each sub-pixel deteriorates, and in particular, when the gray scale is low, defects such as "Burn-in" may occur due to non-uniform display brightness. Therefore, the light emitting element of the sub-pixel is required to be compensated for.

In order to realize the compensation for the light emitting element of the sub-pixel, in the related AMOLED display device, each column of sub-pixels is coupled to one detection line for detecting properties of the sub-pixels, and each detection line is coupled to one signal port.

However, the AMOLED display device includes a plurality of columns of sub-pixels and the number of signal ports is the same as the number of columns of the sub-pixels, so the number of signal ports is relatively large in the AMOLED display device, which results in a relatively high manufacturing cost for the AMOLED display device.

The present disclosure at least partially solves the problem of the manufacturing cost for the existing OLED display substrate being high due to the large number of signal ports required by the detection lines.

Exemplarily, as shown in FIGS. 1 to 6, there is provided an OLED display substrate, including: a plurality of sub-pixels 10 arranged in an array, a plurality of gate lines Scan1, a plurality of data lines Data, a plurality of first control lines Scan2, and a plurality of detection lines Sen.

Each sub-pixel 10 includes: a switch transistor T1, a first control transistor T2, a driving transistor T3 and a light emitting element Diode, where the driving transistor T3 is configured to drive the light emitting element Diode to emit light.

Gates of the switch transistors T1 in each row of sub-pixels 10 are coupled to one gate line Scan, first electrodes of the switch transistors T1 in each column of sub-pixels 10 are coupled to one data line Data, gates of the first control transistors T2 in each row of sub-pixels 10 are coupled to one first control line Scan2, first electrodes of the first control transistors T2 in each column of sub-pixels 10 are coupled to the driving transistors T3, second electrodes of the first control transistors T2 in each column of sub-pixels 10 are coupled to one detection line Sen through a first node, and the detection line Sen is configured to detect the sub-pixels 10 through the first control transistors T2.

The sub-pixels 10 are divided into a plurality of groups by columns, each group of sub-pixels 10 includes at least two columns of sub-pixels 10, the detection lines Sen corresponding to all the sub-pixels 10 in each group of sub-pixels 10 are coupled to one bus, and each bus is coupled to one signal port Vsen.

The point where each detection line Sen is coupled to the bus is a node P, at least one second control transistor T4 is disposed between the first node for each sub-pixel 10 and the node P for the detection line Sen corresponding thereto, and gate electrodes of all the second control transistors T4 corresponding to each column of sub-pixels 10 are coupled to one second control line Sw.

That is, for each sub-pixel 10, the switch transistor T1 may be controlled to be turned on by the gate line Scan1, and the driving transistor T3 is controlled to be turned on by the signal of the data line Data through the switch transistor T1, so that the light emitting element Diode receives the signal from a first voltage terminal VDD; meanwhile, the first control transistor T2 is turned on by the first control line Scan2, and the second control transistor T4 is turned on by the second control line Sw, so that the detection line Sen can read the detection value of the sub-pixel 10 through the first control transistor T2 and the second control transistor T4, so as to detect the sub-pixel 10.

Each gate line Scan1 may control the switch transistors T1 in a row of sub-pixels 10 at the same time, i.e., data lines Data for a row of sub-pixels 10 may simultaneously provide signals to the row of sub-pixels 10. Each first control line Scan2 may control the first control transistors T2 in a row of sub-pixels 10 at the same time, i.e., the detection values of a plurality of sub-pixels 10 in a row may be output to the external of the sub-pixels 10. However, since the detection lines Sen for a plurality of sub-pixels 10 belonging to a same group in a row of sub-pixels 10 are coupled to one signal port Vsen, in order to avoid mixing the signals of the plurality of sub-pixels 10 in the same row and belonging to the same group, the second control transistors T4 need to be controlled by the second control lines Sw, so that only one of a plurality of second control transistors T4 corresponding to the plurality of sub-pixels 10 in the same row and belonging to the same group is turned on at a time, and thus, the detection value of only one sub-pixel 10 of the plurality of sub-pixels 10 in the same row and belonging to the same group can be output to the signal port Vsen at any time.

Since each group has one sub-pixel 10 turned on at a time, the signals of the second control lines Sw for the sub-pixels 10 being detected simultaneously in each group can be synchronized, even these second control lines Sw may be coupled to one port, so the second control lines Sw will not increase the control difficulty.

In the OLED display substrate of the present embodiment, all the detection lines Sen corresponding to a group of sub-pixels 10 correspond to a same signal port Vsen, and therefore, compared to the case that the detection lines Sen for different columns of sub-pixels 10 correspond to different signal ports Vsen in the prior art (that is, the number of the signal ports Vsen for the detection lines Sen is the same as that of the columns of the sub-pixels 10), the OLED display substrate of the present disclosure can reduce the number of the signal ports Vsen for the detection lines Sen, thereby reducing the wiring space, easily implementing a narrow bezel of the OLED display substrate, and facilitating mass production of products, and reducing the cost.

According to an embodiment of the present disclosure, there is provided a method for driving an OLED display substrate, where the OLED display substrate is the OLED display substrate described above, and the method includes:

detecting sub-pixels 10 to be detected in any row of sub-pixels 10, which includes: providing a turn-on signal to the gate line Scan1 and the first control line Scan2 corresponding to the row of sub-pixels 10, providing a turn-off signal to the rest of the gate lines Scan1, providing a detection signal to each data line Data, providing a turn-on signal to the second control lines Sw corresponding to the sub-pixels 10 to be detected, and providing a turn-off signal to the rest of the second control lines Sw, so that the detection lines Sen detect the sub-pixels 10 to be detected to obtain detection values, where the sub-pixels 10 to be detected consists of one sub-pixel 10 of each group of sub-pixels 10 in the row.

That is, when the turn-on signal is provided to the second control lines Sw corresponding to the columns where the sub-pixels 10 to be detected are located, the second control transistors T4 corresponding to the columns where the sub-pixels 10 to be detected are located are turned on, so that each signal port Vsen can be only used for detecting one sub-pixel 10 to be detected in the corresponding group of sub-pixels 10.

Of course, at different detection timings, the remaining sub-pixels 10 in the group to which the sub-pixel 10 to be detected belongs may also be detected through the signal port Vsen, where the remaining sub-pixels 10 in the group to which the sub-pixel 10 to be detected belongs may be in a same row as or different rows from the sub-pixel 10 to be detected.

Exemplarily, as shown in FIGS. 1 to 6, there is provided an OLED display substrate, including: a plurality of sub-pixels 10 arranged in an array, a plurality of gate lines Scan1, a plurality of data lines Data, a plurality of first control lines Scan2, and a plurality of detection lines Sen.

Each sub-pixel 10 includes: a switch transistor T1, a first control transistor T2, a driving transistor T3 and a light emitting element Diode, where the driving transistor T3 is configured to drive the light emitting element Diode to emit light.

Gates of the switch transistors T1 in each row of sub-pixels 10 are coupled to one gate line Scan, first electrodes of the switch transistors T1 in each column of sub-pixels 10 are coupled to one data line Data, gates of the first control transistors T2 in each row of sub-pixels 10 are coupled to one first control line Scan2, first electrodes of the first control transistors T2 in each column of sub-pixels 10 are coupled to one detection line Sen, and the detection line Sen is configured to detect the sub-pixels 10 through the first control transistors T2;

The sub-pixels 10 are divided into a plurality of groups by columns, each group of sub-pixels 10 includes at least two columns of sub-pixels 10, the detection lines Sen corresponding to all the sub-pixels 10 in each group of sub-pixels 10 are coupled to one bus, and each bus is coupled to one signal port Vsen.

The point where each detection line Sen is coupled to the bus is a node P, at least one second control transistor T4 is disposed between each sub-pixel 10 and the node P for the detection line Sen corresponding thereto, and gate electrodes of all the second control transistors T4 corresponding to each column of sub-pixels 10 are coupled to one second control line Sw.

That is, for each sub-pixel 10, the switch transistor T1 may be controlled to be turned on by the gate line Scan1, and the driving transistor T3 is controlled to be turned on by the signal of the data line Data through the switch transistor T1, so that the light emitting element Diode receives the signal from a first voltage terminal VDD; meanwhile, the first control transistor T2 is turned on by the first control line Scan2, and the second control transistor T4 is turned on by the second control line Sw, so that the detection line Sen can read the detection value of the sub-pixel 10 through the first control transistor T2 and the second control transistor T4, so as to detect the sub-pixel 10.

Each gate line Scan1 may control the switch transistors T1 in a row of sub-pixels 10 at the same time, i.e., each data line Data for a row of sub-pixels 10 may simultaneously provide signals to the row of sub-pixels 10. Each first control line Scan2 may control the first control transistors T2 in a row of sub-pixels 10 at the same time, i.e., the detection values of a plurality of sub-pixels 10 in a row may be output to the external of the sub-pixels 10 at the same time. Since the detection lines Sen for a plurality of sub-pixels 10 belonging to a same group in a row of sub-pixels 10 are finally coupled to one signal port Vsen, in order to avoid mixing the signals of the plurality of sub-pixels 10 in the same row and belonging to the same group, the second control transistors T4 need to be controlled by the second control lines Sw, so that only one of a plurality of second control transistors T4 corresponding to the plurality of sub-pixels 10 in the same row and belonging to the same group is turned on at a time, and thus, the detection value of only one sub-pixel 10 of the plurality of sub-pixels 10 in the same row and belonging to the same group can be output to the signal port Vsen at any time.

Since each group has one sub-pixel 10 turned on at a time, the signals of the second control lines Sw for the sub-pixels 10 being detected simultaneously in each group can be synchronized, even these second control lines Sw may be coupled to one port, so the second control lines Sw will not increase the control difficulty.

In the OLED display substrate of the present embodiment, all the detection lines Sen corresponding to a group of sub-pixels 10 correspond to a same signal port Vsen, and therefore, compared to the case that the detection lines Sen for different columns of sub-pixels 10 correspond to different signal ports Vsen in the prior art (that is, the number of the signal ports Vsen of the detection lines Sen is the same as that of the columns of the sub-pixels 10), the OLED display substrate of the present disclosure can reduce the number of the signal ports Vsen for the detection lines Sen, thereby reducing the wiring space, easily implementing a narrow bezel of the OLED display substrate, facilitating mass production of products, and reducing the cost.

In some embodiments, each sub-pixel 10 is coupled to its corresponding detection line Sen through one second control transistor T4.

Figure 3A:
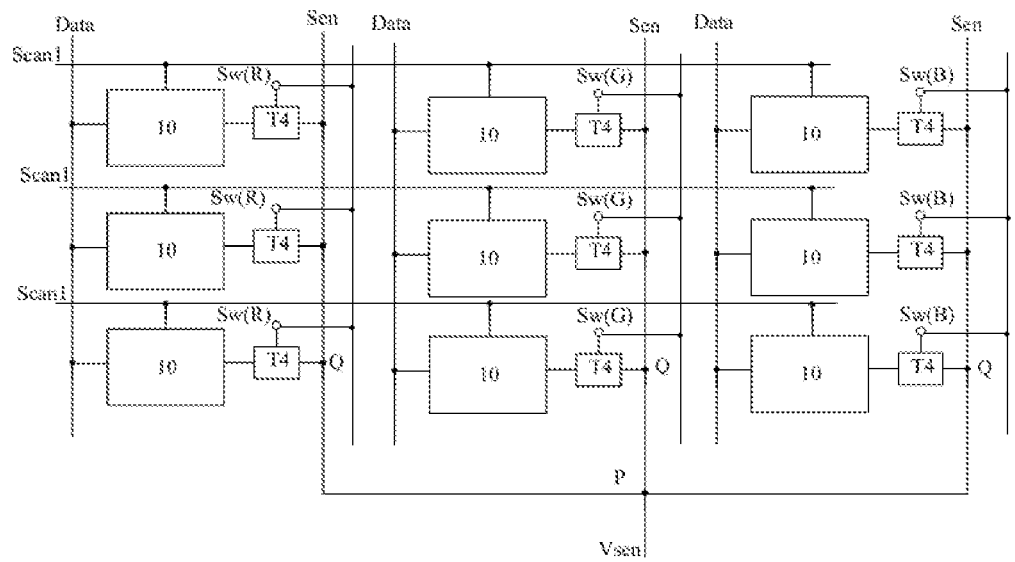
FIGS. 3a and 3b are schematic diagrams illustrating connection relationships of a group of sub-pixels of an OLED display substrate according to an embodiment of the present disclosure.

As shown in FIG. 3a, as an implementation of the present embodiment, each sub-pixel 10 corresponds to one second control transistor T4. For each sub-pixel 10, the second control transistor T4 corresponding thereto may be coupled between the first electrode of the first control transistor T2 of the sub-pixel 10 and the detection line Sen corresponding thereto, so that the number of the second control transistors T4 is the same as the number of the sub-pixels 10.

The essence of the present solution is that each second control transistor T4 can control whether the signal from the corresponding sub-pixel 10 enters the detection line Sen, so that the second control transistor T4 can realize the detection of one sub-pixel 10 in a group of sub-pixels 10 through one signal port Vsen.

In some embodiments, on each detection line Sen, a point where a sub-pixel 10, which is closest to the node P, in each column of sub-pixels and the detection line Sen are coupled is a node Q, and a second control transistor T4 is disposed between the node Q and the node P for the detection line Sen.

Figure 3B:
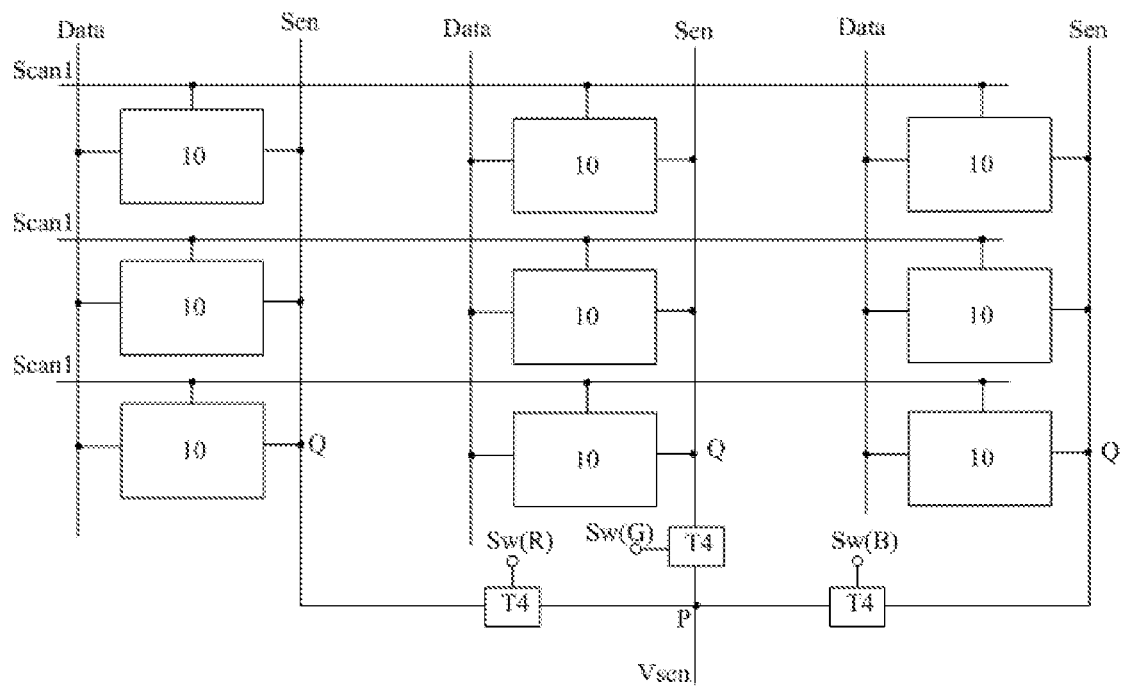

As shown in FIG. 3b, as another implementation of the present embodiment, each second control transistor T4 may correspond to a column of sub-pixels 10, and control whether the signal of the column of sub-pixels 10 (or the detection line Sen corresponding to the column of sub-pixels) enters the signal port Vsen.

In both implementations, the second control transistor T4, in cooperation with the first control transistor T2, can realize the detection of one sub-pixel 10 in a group of sub-pixels 10 through one signal port Vsen.

In some embodiments, each group of sub-pixels 10 consists of three adjacent columns of sub-pixels 10.

That is, three detection lines Sen (corresponding to three columns of sub-pixels 10) adjacent to each other may be coupled to a same signal port Vsen.

Such a connection mode can reduce the number of the signal ports Vsen, thereby reducing the wiring space, more easily realizing the narrow bezel of the OLED display substrate and saving the cost.

In some embodiments, the sub-pixels 10 include red sub-pixels 10, green sub-pixels 10, and blue sub-pixels 10, the sub-pixels 10 in a same column have a same color, and each group of sub-pixels 10 includes a column of red (R) sub-pixels 10, a column of green (G) sub-pixels 10, and a column of blue (B) sub-pixels 10.

That is, one signal port Vsen may correspond to the detection lines Sen for the adjacent three columns of red, green and blue sub-pixels 10. In this way, the signal port Vsen can only detect the sub-pixels 10 of the same color in a row of sub-pixels 10 in cooperation with the corresponding fourth switch transistor T4 for each sub-pixel 10.

For example, only the red sub-pixels 10 in a first row of sub-pixels 10 are detected in a first detection period, only the green sub-pixels 10 in the first row of sub-pixels 10 are detected in a second detection period, and only the blue sub-pixels 10 in the first row of sub-pixels 10 are detected in a third detection period.

In some embodiments, in each sub-pixel 10, the driving transistor T3 is coupled in series with the light emitting element Diode, and the first electrode of the first control transistor T2 is coupled between the driving transistor T3 and the light emitting element Diode; the gate electrode G of the driving transistor T3 is coupled to the second electrode of the switch transistor T1, the first electrode of the driving transistor T3 is coupled to the first voltage terminal VDD, and the second electrode S of the driving transistor T3 is coupled to the light emitting element Diode.

Each sub-pixel 10 further includes a storage capacitor Cs having a first electrode coupled to the second electrode of the switch transistor T1 and a second electrode coupled to the second electrode S of the driving transistor T3.

In some embodiments, the OLED display substrate is used in an OLED display device, which may be any product or component having a display function, such as electronic paper, a mobile phone, a tablet computer, a television, a display, a notebook computer, a digital photo frame, and a navigator.

According to another embodiment of the present disclosure, there is provided a method for driving an OLED display substrate, where the OLED display substrate is the OLED display substrate described above, the method includes following steps S11 and S12.

In step S11, sub-pixels 10 to be detected in any row of sub-pixels 10 are detected, which includes: providing a turn-on signal to the gate line Scan1 and the first control line Scan2 corresponding to the row of sub-pixel 10, providing a turn-off signal to the rest of the gate lines Scan1, providing a detection signal to each data line Data, providing a turn-on signal to the second control lines Sw corresponding to the sub-pixels 10 to be detected, and providing a turn-off signal to the rest of the second control lines Sw, so that the detection lines Sen detect the sub-pixels 10 to be detected to obtain detection values, where the sub-pixels 10 to be detected consists of one sub-pixel 10 of each group of sub-pixels 10 in the row.

In a case where the detection signal provided to each data line Data is a signal capable of causing the light emitting element Diode to emit light, the detection value may be a voltage value at the second electrode of the driving transistor T3 of the sub-pixel 10 to be detected. It should be noted that, after the OLED display substrate is used for a period of time, the light emitting element Diode itself may be aged due to a change of material properties, so that partial voltages of the light emitting element Diode and the driving transistor T3 coupled in series are changed (the voltage provided by the first voltage terminal VDD coupled to the driving transistor T3 and the voltage provided by the second voltage terminal VSS coupled to the light emitting element Diode are not changed), a voltage (cross voltage) at the second electrode S of the driving transistor T3 is changed when the light emitting element Diode emits light, and the voltage at the second electrode S of the driving transistor T3 is the detection value in the present disclosure.

In some embodiments, the detection signal is a display signal that enables the OLED display substrate to display a white image with a predetermined brightness.

That is, a pixel composed of a plurality of sub-pixels 10 in the OLED display substrate emits white light under the control of the detection signal.

That is, the detection signals received by all the detected sub-pixels 10 during the detection process are uniform, so that the difference of the voltages at the second electrode S of the driving transistor T3 can be obtained more easily and accurately, and a more accurate compensation value can be obtained.

Of course, the detection signal supplied to each data line Data may be a detection signal for detecting a threshold voltage (Vth) or a mobility (K) of the driving transistor T3, and will not be described in detail herein.

In step S12, an obtained detection value is compared with an original value of a corresponding sub-pixel 10 to obtain a compensation value ($L_T$) for the sub-pixel 10.

Figure 4:
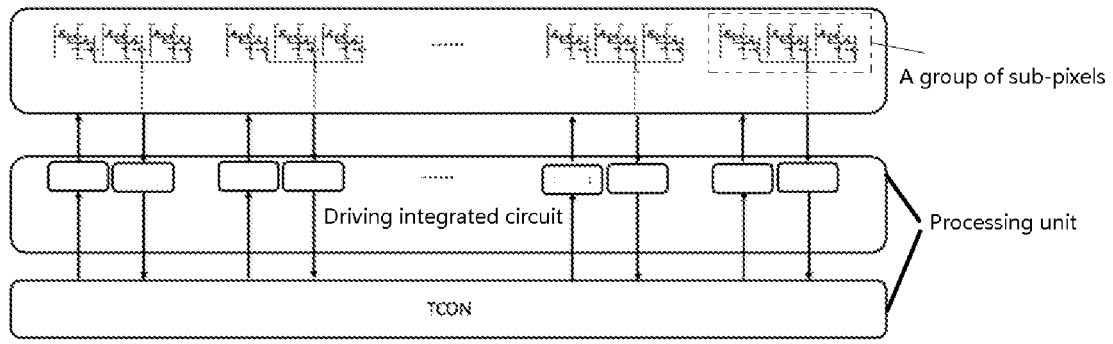
FIG. 4 is a schematic diagram illustrating a structure of a driving part of an OLED display substrate according to an embodiment of the present disclosure.

The original value of the sub-pixel 10 corresponds to a detection value obtained by detecting the display substrate when products leave factories, that is, an initial value when products leave factories. By detecting the voltages at the second electrode S of the driving transistor T3 of the same sub-pixel 10 in two detection phases, a difference ($\Delta V$) between these two voltage values is obtained, which indicates a voltage change at the second electrode S of the driving transistor T3 between the two detection phases, and a processing unit converts the voltage difference to finally obtain the compensation value ($L_T$), as shown in FIG. 4. The processing unit may include a logic board TCON, a driving integrated circuit, and the like.

After obtaining the compensation values, if the sub-pixels 10 continue to perform normal display, each sub-pixel 10 may be compensated for according to the compensation value. However, the compensation method for the sub-pixels 10 is various, and for example, the display signal provided by the data line Data may be changed, or the voltage of the light emitting element Diode may be directly compensated for through the detection line Sen.

In some embodiments, the method for driving the OLED display substrate includes: in each frame of a detection phase including a plurality of frames, detecting the sub-pixels 10 to be detected in a row of sub-pixels 10, and detecting each sub-pixel 10 as the sub-pixel 10 to be detected once in the detection phase.

Since during the normal display, it is rare to encounter a case where the display signals of the sub-pixels 10 in one row are just the required detection signals (i.e., signals for displaying a white image with a predetermined brightness). A dedicated detection phase may be provided in which the display signal supplied to each sub-pixel 10 is always the detection signal, so that a white image is actually displayed continuously during this phase.

Based on the consideration of the detection time, in the above process of continuously displaying the white image, only a part of the sub-pixels 10 in a row of the sub-pixels 10 may be detected per frame of image. Each frame includes a display time during which a display signal is written for each row and a subsequent holding time (about 24 ms), during which the detection may be performed. This is because, although there is a certain interval (blanking) between writing of the display signals into different rows, the interval is too short (about 24 s) to convert the voltage difference into the compensation value by the processing unit, which requires about s. Therefore, the detection may be performed during the holding time, and only a part of the sub-pixels 10 in a row of the sub-pixels 10 (e.g. ⅓ of the sub-pixels 10 in a row of sub-pixels 10) is detected in one frame, so multiple frames (e.g. three frames) are required for detecting all sub-pixels in a row of sub-pixels 10.

For example, if the OLED display substrate has 720 rows of sub-pixels 10 in total, and the detection on the sub-pixels of one color in one row of sub-pixels needs to be performed within the holding time of one frame, it takes three frames to detect the red, green and blue sub-pixels in one row, so the detection phase takes 2160 frames in total, and the display time per frame is ¹⁄₆₀ s. Thus, it takes 36 seconds to detect all the sub-pixels (i.e., the time required for detecting the sub-pixels of the whole screen is 36 s).

Figure 5:
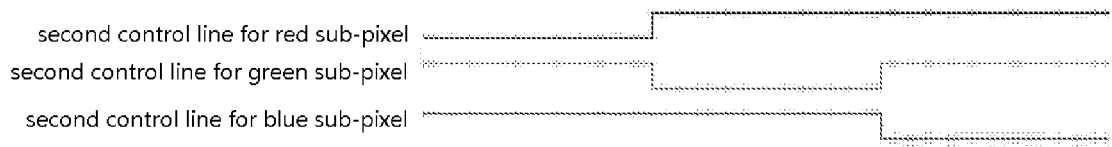
FIG. 5 is a timing diagram for second control lines corresponding to sub-pixels having respective colors in a detection phase for an OLED display substrate according to an embodiment of the present disclosure.
Figure 6:
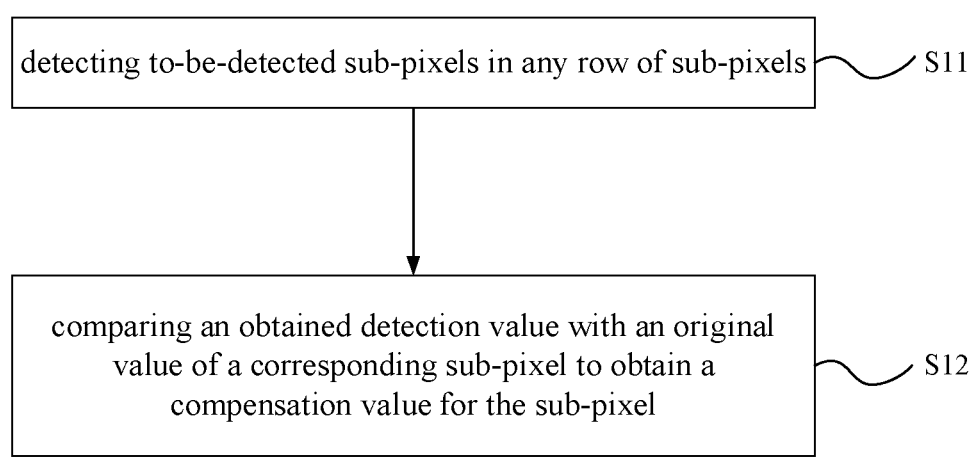
FIG. 6 is a flowchart illustrating a method for driving an OLED display substrate according to an embodiment of the present disclosure.

As shown in FIG. 5, in the detection stage, all the red sub-pixels 10 in all the rows may be detected sequentially, and after that, all the green sub-pixels 10 in all the rows may be detected sequentially, and finally, all the blue sub-pixels 10 in all the rows may be detected sequentially (in the figure, a turn-on signal is at a low level). Thus, the signal switching in the second control line Sw is minimized, and the control is simplest.

In some embodiments, after completing the detection phase once (i.e., after detecting all the sub-pixels), the method further includes: after a predetermined time, performing the detection phase again.

That is, the OLED display substrate is periodically detected. Since the properties of the light emitting element Diode in each sub-pixel 10 may change significantly only after a long time, the sub-pixel 10 does not need to be detected in real time (for example, detection is performed between frames of normal display), and since a white image generated during real-time detection affects normal display, the detection phase should not be performed too frequently, but may be performed periodically, that is, the detection phase is performed periodically to reduce the influence on normal display. A timer of the OLED display substrate may be used for reminding the user at regular time (for example, reminding once in a half year) so as to realize the detection.

Of course, the detection may be performed at other times. For example, before each shutdown, the above method is used to detect the OLED display substrate.

It should be noted that, in this application, relational terms such as first and second are used solely to distinguish one entity or action from another entity or action without necessarily requiring or implying any actual such relationship or order between such entities or actions. Also, the terms "include," "comprise," or any other variation thereof, are intended to cover a non-exclusive inclusion, such that a process, a method, an article, or an apparatus that includes a list of elements include those elements, and further may include other elements not expressly listed or inherent to such process, method, article, or apparatus. Without further limitation, an element defined by the phrase "including an . . . . . . " does not exclude the presence of other identical elements in the process, method, article, or apparatus that includes the element.

In accordance with the embodiments of the present disclosure, as set forth above, these embodiments are not exhaustive of all details, nor are they limiting the present disclosure to the specific embodiments described. Obviously, many modifications and variations are possible in light of the above teaching. The embodiments were chosen and described in order to best explain the principles of the present disclosure and the practical application, to thereby enable others skilled in the art to best utilize the present disclosure and various modifications based on the present disclosure. The present disclosure is to be limited only by the claims and their full scope and equivalents.

What is claimed is:

1. An organic light emitting diode (OLED) display substrate, comprising: a plurality of sub-pixels arranged in an array, a plurality of detection lines, and at least one signal port,
wherein each column of sub-pixels is coupled to one of the plurality of detection lines, each signal port is coupled to at least two detection lines, and each of the at least two detection lines is coupled to one column of sub-pixels;
each sub-pixel comprises a light emitting element and a first control circuit coupled to the light emitting element, the first control circuit is configured to transmit a voltage at one terminal of the light emitting element to a first node in response to a first control signal provided by a first control line; and
each sub-pixel further comprises a second control circuit between the first node and the detection line corresponding to the sub-pixel, the second control circuit is configured to transmit a voltage at the first node to a corresponding signal port in response to a second control signal provided by a second control line, and a number of the second control circuits is the same as a number of the plurality of sub-pixels.

2. The OLED display substrate of claim 1, wherein the first control circuit comprises a first control transistor having a control electrode coupled to the first control line, a first electrode coupled to one terminal of the light emitting element, and a second electrode coupled to the first node.

3. The OLED display substrate of claim 2, wherein the second control circuit comprises a second control transistor having a control electrode coupled to the second control line, a first electrode coupled to the first node, and a second electrode coupled to a corresponding signal port.

4. The OLED display substrate of claim 3, wherein each sub-pixel is coupled to a detection line corresponding to the sub-pixel through one second control transistor.

5. The OLED display substrate of claim 3, wherein the first node for each sub-pixel is coupled to a corresponding detection line and each column of sub-pixels is coupled to a corresponding signal port through one second control transistor.

6. The OLED display substrate of claim 4, wherein control electrodes of all second control transistors corresponding to each column of sub-pixels are coupled to a same second control line.

7. The OLED display substrate of claim 2, wherein control electrodes of first control transistors in a same row of sub-pixels are coupled to a same first control line.

8. The OLED display substrate of claim 3, wherein sub-pixels in a same column have a same color, and each signal port is coupled to at least two columns of sub-pixels having different colors.

9. The OLED display substrate of claim 8, wherein control electrodes of second control transistors coupled to sub-pixels having a same color are coupled to a same second control line.

10. The OLED display substrate of claim 3, wherein each of the plurality of sub-pixels further comprises a switch transistor and a driving transistor, and the driving transistor is configured to drive the light emitting element to emit light,
the switch transistor has a control electrode coupled to a gate line, a first electrode coupled to a data line, and a second electrode coupled to a control electrode of the driving transistor;
the driving transistor has a first electrode coupled to a first voltage terminal, and a second electrode coupled to the first electrode of the first control transistor; and
the other terminal of the light emitting element is coupled to a second voltage terminal.

11. The OLED display substrate of claim 10, wherein control electrodes of switch transistors in each row of sub-pixels of the plurality of sub-pixels are coupled to a same gate line, first electrodes of switch transistors in each column of sub-pixels of the plurality of sub-pixels are coupled to a same data line, and the control electrode of the first control transistor of each sub-pixel in a same row is coupled to a same first control line.

12. The OLED display substrate of claim 11, wherein each sub-pixel further comprises:
a storage capacitor, which has a first terminal coupled to the second electrode of the switch transistor, and a second terminal coupled to the second electrode of the driving transistor.

13. A method for driving an organic light emitting diode (OLED) display substrate, the OLED display substrate being the OLED display substrate of claim 1, the method comprising:
in a detection phase for a row of sub-pixels, providing a turn-on signal to the first control line corresponding to the row of sub-pixels, and providing a turn-on signal to the second control line corresponding to a to-be-detected sub-pixel in the row of sub-pixels,
wherein different sub-pixels in a same row and coupled to a same signal port serve as the to-be-detected sub-pixels at different times.

14. The method of claim 13, wherein each of the plurality of sub-pixels comprises a switch transistor and a driving transistor,
wherein control electrodes of switch transistors in each row of sub-pixels of the plurality of sub-pixels are coupled to a same gate line, first electrodes of switch transistors in each column of sub-pixels of the plurality of sub-pixels are coupled to a same data line, and a control electrode of the first control transistor of each sub-pixel in a same row is coupled to a same first control line,
wherein the method comprises:
in a detection phase for a row of sub-pixels, providing a turn-on signal to a gate line and a first control line corresponding to the row of sub-pixels, providing a turn-off signal to gate lines corresponding to remaining rows of sub-pixels, providing a detection signal to each data line, providing a turn-on signal to a second control line corresponding to sub-pixels in a column to which the to-be-detected sub-pixel belongs, and providing a turn-off signal to second control lines corresponding to remaining columns of sub-pixels, so as to detect the to-be-detected sub-pixel to obtain a detection value.

15. The method of claim 14, wherein the detection signal is a display signal capable of causing the light emitting element to emit light.

16. The method of claim 15, wherein the detection signal is a display signal capable of causing the OLED display substrate to display a white image with a predetermined brightness.

17. The method of claim 16, wherein
the detection phase for the OLED display substrate comprises a plurality of detection sub-phases,
in each of the plurality of detection sub-phases, a to-be-detected sub-pixel in a row of sub-pixels is detected,
each of the plurality of detection sub-phases is within a holding time after a display time of each frame of image, and
in the detection phase, each of the plurality of sub-pixels is detected once as the to-be-detected sub-pixel.

18. The method of claim 17, wherein the OLED display substrate is detected periodically.

19. The method of claim 14, wherein after the to-be-detected sub-pixel in any row of sub-pixels of the plurality of sub-pixels has been detected, the method further comprises:
comparing the obtained detection value with an original value of a corresponding sub-pixel, so as to obtain a compensation value for the sub-pixel.

20. The method of claim 19, wherein the sub-pixel is compensated for by:
changing a display signal provided by a data line corresponding to the sub-pixel based on the compensation value; and
compensating a voltage of a light emitting element in the sub-pixel based on the compensation value through a detection line corresponding to the sub-pixel.

* * * * *